(12) United States Patent
Blair et al.

(10) Patent No.: US 6,304,129 B1
(45) Date of Patent: Oct. 16, 2001

(54) COMPENSATION CIRCUIT AND METHOD FOR A POWER TRANSISTOR

(75) Inventors: Cynthia Blair; Henrik Sjoden, both of Morgan Hill, CA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/415,524

(22) Filed: Oct. 8, 1999

(51) Int. Cl.[7] .................................................. H03K 17/14
(52) U.S. Cl. .............................................. 327/378; 327/427
(58) Field of Search ................................... 327/378, 379, 327/389, 427, 434, 538, 560, 563

(56) References Cited

U.S. PATENT DOCUMENTS

| | | | |
|---|---|---|---|
| 5,164,679 | 11/1992 | Dittmer | 330/298 |
| 5,214,315 | * 5/1993 | Dunnam | 327/379 |
| 5,281,925 | * 1/1994 | Hulick | 330/296 |
| 6,049,704 | * 4/2000 | Peckham et al. | 455/232.1 |
| 6,091,279 | * 7/2000 | Hamparian | 327/513 |

FOREIGN PATENT DOCUMENTS 0 601 410 A1  6/1994  (EP).
0 625 822 A2  11/1994  (EP).

OTHER PUBLICATIONS

PCT, International Search Report, PCT/US00/27199, Jan. 2, 2001.

* cited by examiner

*Primary Examiner*—My-Trang Nu Ton
(74) *Attorney, Agent, or Firm*—Jenkens & Gilchrist P.C.

(57) ABSTRACT

A circuit and method are disclosed for biasing a power transistor to offset unwanted variations in the operating characteristics thereof. The circuit includes a correction transistor having the same device structure as the structure of the power transistor. In addition, one or more dimensions of the correction transistor is scaled relative to corresponding dimensions of the power transistor. The correction transistor is biased so that the ratio of drain currents of the correction transistor and the power transistor is the same as the size ratio thereof. In this way, the output signal of the correction transistor is based upon an unwanted variation in the operating characteristics of the power transistor. The output terminal of the correction transistor is amplified and coupled to the control terminal of the power transistor so that the bias signal applied to the control terminal thereof offsets the unwanted variation in the operating characteristics of the power transistor.

28 Claims, 2 Drawing Sheets

COMPENSATION CIRCUIT AND METHOD FOR A POWER TRANSISTOR

BACKGROUND OF THE INVENTION

1. Technical Field of the Invention

The present invention relates to a compensation circuit for a power transistor, and particularly to a compensation circuit for biasing a power transistor to offset unwanted variations in the operating characteristics thereof.

2. Background of the Invention

Power transistors have been utilized for years in providing relatively sizeable current levels for applications in a number of markets, such as audio, video, consumer, multi-media and wireless communications. Concerning wireless communications, power transistors are commonly used in amplification stages for radio base station amplifiers and other radio frequency (RF) applications. Such transistors, when used for power amplification at high frequencies, need to meet numerous detailed requirements for output power, gain, robustness, efficiency, stability, bandwidth, etc., at a specified supply voltage and operating frequency.

At least one type of power transistor utilized in power applications is a field effect transistor and particularly a MOS transistor. Like the performance of most all transistors, the operating characteristics of MOS power transistors are affected by a number of conditions and/or phenomenon. Temperature and process variations may cause changes in the operating characteristics of a power transistor. In addition, MOS transistors, such as lateral diffused MOS (LDMOS) transistors, may exhibit gate oxide charging over time. Specifically, electrons in the channel region of a MOS transistor can be accelerated by the source-drain electric field, surmount the channel region-gate oxide interfacial barrier and become trapped in the gate oxide region of the MOS transistor. The trapped electrons in the gate oxide region change the device characteristics of the MOS transistor, including shifting the threshold voltage thereof. For an enhancement mode MOS transistor, the threshold voltage increases as the number of charges in the gate oxide region increases. This shift in the threshold voltage of a MOS transistor may cause a dramatic change in the quiescent current level thereof. A change in the quiescent current level effects the overall linearity performance and small signal gain of the MOS transistor. As can be seen, there is a need to account for changes in the performance of MOS transistors caused by any of a number of phenomenon.

SUMMARY OF THE INVENTION

The present invention overcomes the shortcomings in prior circuits and systems and thereby satisfies a significant need for a bias circuit for a power transistor which compensates for one or more changes in the operating characteristics of the power transistor while biasing the power transistor. The bias circuit biases the gate terminal of the power transistor so that the power transistor performs as intended. The bias circuit includes a correction transistor which has a similar device structure to the device structure of the power transistor. The correction transistor may be fabricated on the same semiconductor substrate as the power transistor or on a semiconductor substrate that is subjected to the same semiconductor fabrication techniques as the semiconductor substrate in which the power transistor is formed. The correction transistor is biased in a manner that is similar to the biasing of the power transistor. As a result, the operating characteristics of the correction transistor substantially mirror the operating characteristics of the power transistor. By making the output bias voltage of the bias circuit a function of the operating characteristics of the correction transistor, the output bias voltage applied to the power transistor provides a correction to offset unwanted variations in the operating characteristics of the power transistor.

A preferred embodiment of the present invention includes an operational amplifier. An input terminal of the operational amplifier is coupled to the output terminal of the correction transistor. The output of the operational amplifier is coupled to the control terminal of the power transistor. In this way, changes in the operating characteristics of the correction transistor (which mirror the operating characteristics of the power transistor) alters the input of the operational amplifier so that the output signal thereof that is applied to the control terminal of the power transistor compensates for the changes in the operating characteristics of the power transistor. In other words, the voltage appearing on the control terminal of the power transistor is changed to offset undesirable changes in the operating characteristics of the power transistor.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
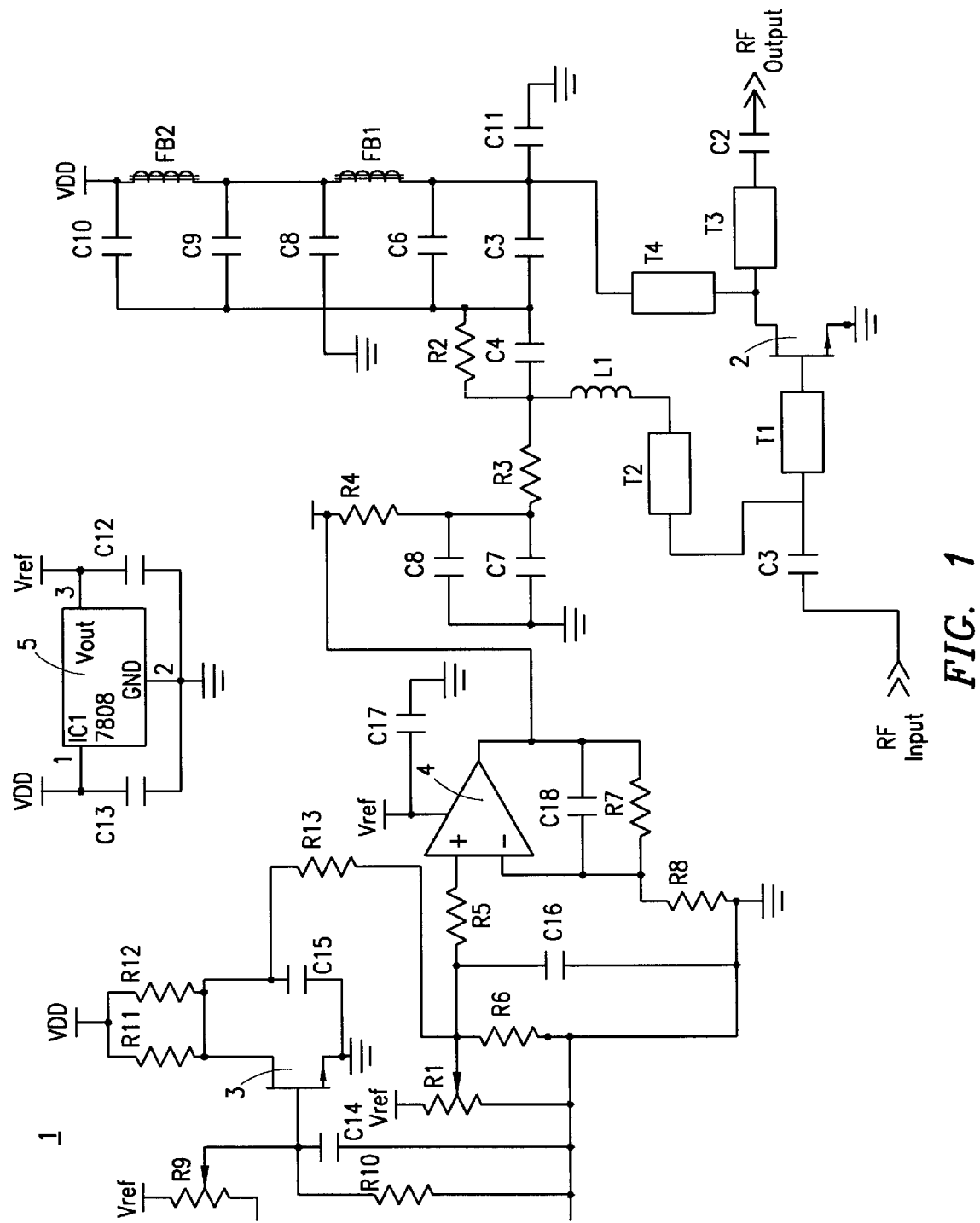
FIG. 1 is a schematic diagram of a preferred embodiment of the present invention.

Referring to FIG. 1, there is disclosed a bias circuit 1 according to a preferred embodiment of the present invention. Bias circuit 1 is adapted to provide a bias voltage to the control terminal of a power transistor 2. Power transistor 2 is described below and illustrated in the drawings as a radio frequency (RF) power MOS transistor which amplifies an RF input signal. It is understood that power transistor 2 may be used in conjunction with bias circuit 1 in other applications as well. It is further understood that power transistor 2 may be another type of power transistor.

In the RF application, an RF input signal is received and passes through capacitor C1 which blocks the DC signal thereof. Matching circuit T1, made up of one or more micro-strip lines and on zero or more capacitors and connected between capacitor C1 and power transistor 2, matches the system impedance seen at the gate terminal of power transistor 2 to the input impedance thereof. Similarly, matching circuit T3, connected to the drain terminal of power transistor 2, matches the system impedance seen at the drain of power transistor 2 to the output impedance thereof. Capacitor C2, connected in series with matching circuit T3, blocks the DC signal component generated by the output signal of power transistor 2.

The drain of power transistor 2 is coupled to the Vdd reference voltage via transmission line T4, which may be a quarter wave line of a relatively high impedance that is shorted at the frequency of operation by capacitor C5 and at lower frequencies by capacitors C3 and C11. Consequently, transmission line T4 has little effect over the operation of power transistor 2 at the frequency of interest while providing the Vdd reference voltage thereto.

A low pass filter, made up of ferrite beads FB1 and FB2 and capacitors C6, C9 and 10, is connected between the Vdd reference and transmission line T4 and isolates power transistor 2 from the Vdd reference.

As stated above, bias circuit 1 generates a DC bias voltage level which is applied to the gate terminal of power transistor 2 so as to offset undesirable changes in the device operating characteristics thereof. In particular, bias circuit 1 utilizes a correction transistor 3 which is adapted to have substantially similar operating characteristics and/or device characteristics to the operating/device characteristics of power transistor 2. Correction transistor 3 preferably possesses the same device structure as power transistor 2. Power transistor 2 and correction transistor 3 may be LDMOS transistors. Further, in order to closely match the device characteristics of power transistor 2, correction transistor 3 may be fabricated in the same semiconductor substrate in which power transistor 2 is fabricated. Alternatively, correction transistor 3 may be fabricated in a different semiconductor substrate from power transistor 2 using the same fabrication process in which power transistor 2 is fabricated. With bias circuit 1 biasing correction transistor 3 similarly to the biasing of power transistor 2 and utilizing correction transistor 3 in generating the DC bias voltage to bias power transistor 2, the DC bias voltage is dependent upon changes in the operating characteristics of correction transistor 3 and power transistor 2.

In a preferred embodiment of the present invention, one or more dimensions of correction transistor 3 are scaled relative to the corresponding dimensions of power transistor 2. For example, dimensions of correction transistor 3 are scaled to be a substantially small fraction of the size of the corresponding dimensions of power transistor 2. In this way, correction transistor 3 is capable of substantially mirroring power transistor 2 without occupying sizeable silicon space or dissipating a significant amount of power.

Bias circuit 1 includes resistors R9 and R10 which bias the gate terminal of correction transistor 3. The resistance values of resistors R9 and R10 are chosen to generate a drain current for correction transistor 3 such that the ratio of the drain current of correction transistor 3 to the drain current of power transistor 2 is substantially the same as the ratio of the size of correction transistor 3 to the size of power transistor 2. A parallel combination of resistors R11 and R12 of bias circuit 1 preferably serves as pull-up devices for correction transistor 3. As can be seen, the drain output voltage of correction transistor 3 varies depending upon changes to the operating characteristics thereof.

According to a first preferred embodiment of the present invention, bias circuit 1 includes an operational amplifier 4. Operational amplifier 4 is configured as an amplifier circuit having a non-inverting closed loop gain. Resistors R5, R7 and R8 are connected to operational amplifier 4 and set the closed loop gain thereof. Resistor R5 has a first terminal connected to the non-inverting input of operational amplifier 4. Resistor R6 has a first terminal connected to a second terminal of resistor R5 and a second terminal connected to the ground potential. Resistor R7 has a first terminal connected to the inverting input of operational amplifier 4 and a second terminal connected to the output thereof. Capacitors C16 (connected to resistor R5) and C18 (connected in parallel with resistor R7) substantially eliminate noise induced into bias circuit 1. Capacitor C17, connected between the Vdd reference for operational amplifier 4 and ground, serves as a bypass capacitor for the supply voltage signal applied to operational amplifier 4. Resistors R1 and R6 serve as a voltage divider in setting a voltage level on the non-inverting input of operational amplifier 4.

Bias circuit 1 further includes resistor R13 which is connected between the drain of correction transistor 3 and the second terminal of resistor R5. Providing resistor R13 between the drain of correction transistor 3 and the non-inverting input of operational amplifier 4 causes the drain voltage of correction transistor 3 to be seen at the input of operational amplifier 4.

Series-connected resistors R3 and R4 are coupled at one end to the output of operational amplifier 4. Resistors R2, R3 and R4 form a voltage divider to reduce the voltage from the output of operational amplifier 4 to the desired level. Inductor L1 and transmission circuit T2, connected between resistor R3 and the input of transmission circuit T1, provide a low impedance DC path to power transistor 2 and a substantially high impedance path at the frequency of operation in order to block the RF input signal. Capacitor C4 is connected to resistor R3 to short any residual RF signaling which may appear at resistor R3.

One benefit of bias circuit 1 according to the preferred embodiment of the present invention described above is that because operational amplifier 4 has a relatively high input impedance, there is a much broader choice of resistance values for resistors R6, R11, R12 and R13.

It is understood that if power transistor 2 and correction transistor 3 are thermally linked, then bias circuit 1 is capable of providing a bias signal to the gate terminal of power transistor 2 that offsets or compensates for variations in the operating characteristics of power transistor 2 caused by the operating temperature of power transistor 2.

Bias circuit 1 may further include a regulator circuit which receives the Vdd supply and provides a regulated reference voltage level that is used to power operational amplifier 4.

In use, a change in the operating characteristics of power transistor 2 similarly occurs in the operating characteristics of correction transistor 3. In the event the change includes an upward shift in the threshold voltage of power transistor 2 and correction transistor 3 due to the trapping of charges in the gate oxide region of power transistor 2 and correction transistor 3, respectively, the drain current in both power transistor 2 and correction transistor 3 will decrease proportionally. The decrease in the drain current of correction transistor 3 results in an increase in the drain voltage thereof, which increases the voltage appearing on the non-inverting input of operational amplifier 4. The output of operational amplifier 4 thereby increases, which increases the DC voltage appearing on the gate terminal of power transistor 2. The increased gate voltage causes an increase in the drain current of power transistor 2. Because the increase in the gate voltage is based upon the change in the operating characteristics of power transistor 2 and correction transistor 3, the change in operating characteristics (drain current decrease) of power transistor 2 is offset or compensated by a substantially equal amount (drain current increase) such that the operating characteristics of power transistor 2 are maintained at the desired levels.

Figure 2:
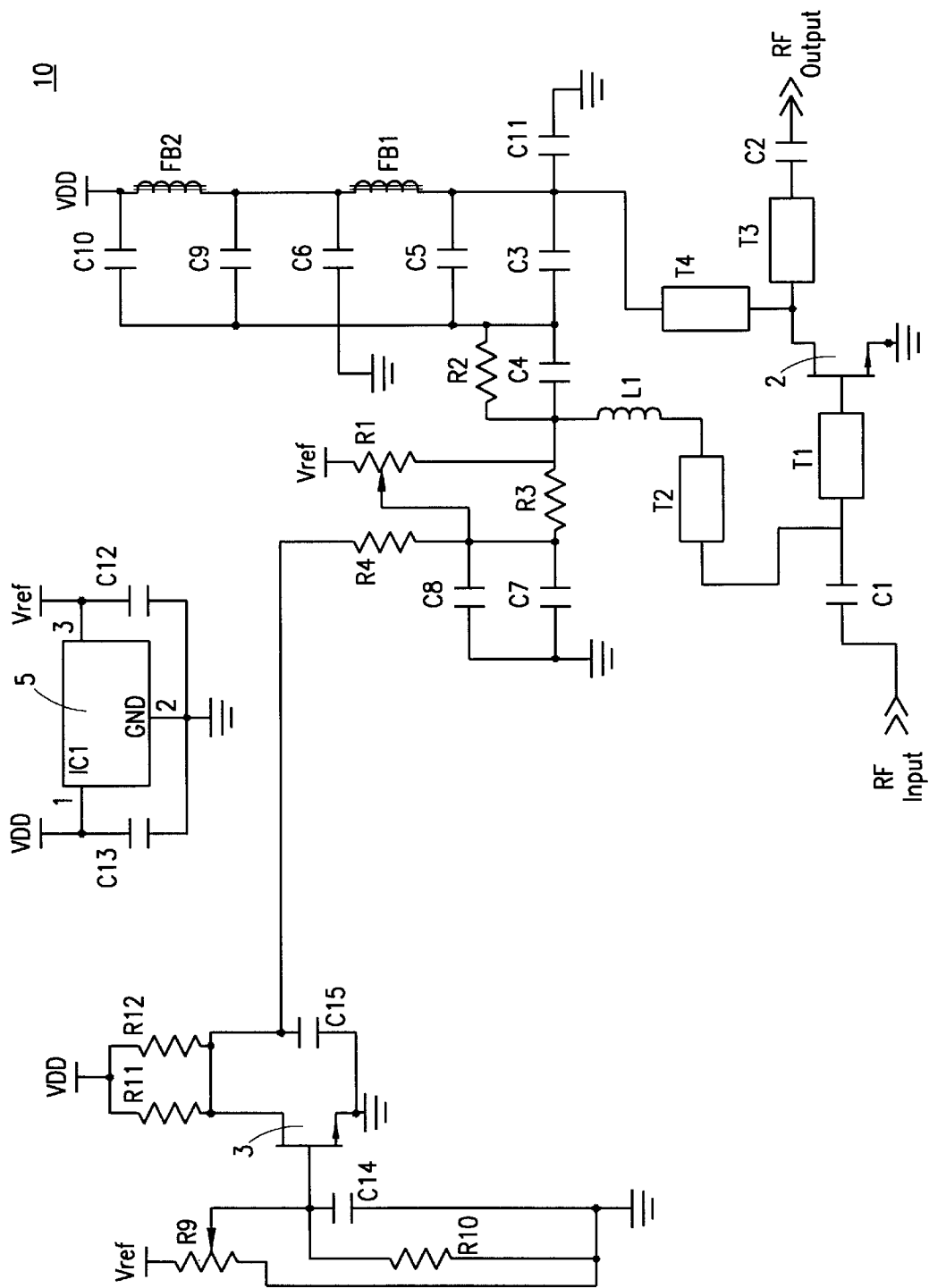
FIG. 2 is a schematic diagram of another embodiment of the present invention.

Another embodiment of the present invention is illustrated in FIG. 2. In bias circuit 10, resistor R1, which provided a primary bias voltage to operational amplifier 4 in bias circuit 1, provides a primary bias voltage to power transistor 2 via resistor R3, inductor L1 and transmission circuit T2. Capacitors C14 and C15, which are connected to the gate and drain terminals of correction transistor 3, respectively, quell stray RF amplification in correction transistor 3. Parallel-connected pull-up resistors R11 and R12 connect the drain terminal of correction transistor 3 to the Vdd reference. The drain voltage of correction transistor 3 is provided to the primary bias circuitry of power transistor 2 through resistor R4. Correction transistor 3 is sized and dimensioned relative to power transistor 2 so as to be a scaled version thereof. As with correction transistor 3 of bias circuit 1, the gate terminal of correction transistor 3 in bias circuit 10 is biased by resistors R9 and R10 so that the ratio of the drain current of correction transistor 3 to the drain current of power transistor 2 is substantially the same as the ratio of the size of correction transistor 3 to the size of power transistor 2. In this way, the output (drain) voltage of correction transistor 3 provides an offset or correction voltage that accounts for unwanted variations in the operating performance of correction transistor 3 and power transistor 2. This offset or correction voltage is added to the primary bias voltage generated by resistor R1 and the resulting bias voltage is applied to the gate terminal of power transistor 2. Consequently, the resulting bias voltage appearing on the gate terminal of power transistor 2 corrects for unwanted variation in the operating performance of power transistor 2 so that power transistor 2 performs as desired.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A biasing circuit for a power transistor, comprising:
    a correction transistor having a device structure which is substantially the same as a device structure of the power transistor;
    a circuit for biasing a control terminal of the correction transistor so that operating characteristics of the correction transistor are substantially similar to operating characteristics of the power transistor, an output terminal of the correction transistor being coupled to a control terminal of the power transistor so that a signal appearing on the control terminal of the power transistor compensates for a variation in the operating characteristics of the power transistor;
    an amplifier circuit having an input connected to the output terminal of the correction transistor and an output coupled to the control terminal of the power transistor; and
    wherein at least one dimension and at least one current level of the correction transistor are scaled relative to a corresponding at least one dimension and a corresponding at least one current level of the power transistor, respectively.

2. The biasing circuit of claim 1, wherein:
    the power transistor and the correction transistor are MOS transistors.

3. The biasing circuit of claim 1, wherein:
    the power transistor and the correction transistor are LDMOS transistors.

4. The biasing circuit of claim 1, further comprising:
    a voltage divider connected between the output of the amplifier circuit and the control terminal of the power transistor.

5. The biasing circuit of claim 4, further comprising:
    a low pass filter circuit, connected between the voltage divider and the control terminal of the power transistor.

6. The biasing circuit of claim 1, further comprising:
    at least one pull-up device connected between a drain terminal of the correction transistor and a voltage reference.

7. The biasing circuit of claim 1, wherein:
    the power transistor receives a RF input signal at the control terminal thereof and generates a RF output signal.

8. The biasing circuit of claim 7, wherein:
    a drain terminal of the power transistor is coupled to a reference voltage.

9. The biasing circuit of claim 1, further comprising:
    a voltage divider connected between an output terminal of the correction transistor and the control terminal of the power transistor.

10. The biasing circuit of claim 1, wherein the amplifier circuit comprises an operational amplifier.

11. A biasing circuit for a power transistor, comprising:
    a correction transistor having a device structure which is substantially the same as a device structure of the power transistor;
    a circuit for biasing a control terminal of the correction transistor so that operating characteristics of the correction transistor are substantially similar to operating characteristics of the power transistor, an output of the correction transistor being coupled to a control terminal of the power transistor so that a signal appearing on the control terminal of the power transistor compensates for a variation in the operating characteristics of the power transistor; and
    wherein:
        one or more dimensions of the correction transistor are scaled relative to corresponding one or more dimensions of the power transistor;
        the correction transistor and the power transistor comprise MOS transistors; and
        changes in the operating characteristics of the correction transistor due to gate oxide charging are reflected in the signal appearing on the control terminal of the power transistor so as to offset changes in the operating characteristics of the power transistor due to gate oxide charging.

12. The biasing circuit of claim 11, wherein:
    a ratio of a current level of the correction transistor to a current level of the power transistor is substantially the same as a ratio of the one or more dimensions of the correction transistor to the corresponding one or more dimensions of the power transistor.

13. A method for biasing a power transistor, comprising the steps of:
    providing a compensation transistor, at least one dimension of the compensation transistor being scaled relative to a corresponding at least one dimension of the power transistor;
    substantially mirroring operating characteristics of the power transistor using, at least partly, the compensation transistor;
    generating a bias signal based upon the mirrored operating characteristics;

coupling the bias signal to a control terminal of the power transistor to compensate for a variation in the operating characteristic of the power transistor; and wherein:

the step of mirroring comprises the step of generating an electrical signal which substantially mirrors a current level of the power transistor;

the step of generating a bias signal comprises the step of amplifying the electrical signal to create an amplified electrical signal; and the step of coupling comprises the step of coupling the amplified electrical signal to the control terminal of the power transistor.

14. The method of claim 13, wherein:

the step of generating an electrical signal further comprises the step of scaling the electrical signal.

15. The method of claim 13, wherein:

the step of mirroring further comprises the step of substantially mirroring a threshold voltage shift of the power transistor; and the step of generating a bias signal further comprises the step or generating the bias signal to offset the threshold voltage shift of the power transistor.

16. An amplifier circuit, comprising:

a first transistor having a control terminal coupled to receive a radio frequency input signal and an output terminal which provides a radio frequency output signal based upon the radio frequency input signal;

a pull-up device connected to the output terminal of the first transistor;

a bias circuit, coupled to the control terminal of the first transistor, for generating a bias signal that biases the first transistor to amplify the radio frequency input signal, the bias circuit including a correction transistor having operating characteristics which substantially mirror operating characteristics of the first transistor, the bias signal being dependent upon the operating characteristics of the correction transistor to compensate for at least one change in the operating characteristics of the first transistor; and wherein:

the operating characteristics of the correction transistor substantially mirror the operating characteristics of the first transistor at least partly as a result of at least one dimension or the correction transistor being scaled relative to a corresponding at least one dimension of the first transistor; and the bias circuit further including an amplifier having an input connected to an output terminal of the correction transistor and an output coupled to the control terminal of the first transistor.

17. The amplifier circuit of claim 16, wherein:

a device structure of the correction transistor is substantially the same as a device structure of the first transistor.

18. The amplifier circuit of claim 16, wherein:

the amplifier comprises an operational amplifier having a non-inverting closed loop gain.

19. The amplifier circuit of claim 16, wherein:

the correction transistor and the first transistor are MOS transistors.

20. The amplifier circuit of claim 19, wherein:

the correction transistor and the first transistor are LDMOS transistors.

21. The amplifier circuit of claim 16, wherein:

the first transistor and the correction transistor have substantially the same temperature characteristics; and changes in the operating characteristics of the correction transistor due to temperature are reflected in the bias signal generated by the bias circuit so as to offset changes in the operating characteristics of the first transistor due to temperature.

22. An amplifier circuit, comprising:

a first transistor having a control terminal coupled to receive a radio frequency input signal and an output terminal which provides a radio frequency output signal based upon the radio frequency input signal;

a pull-up device connected to the output terminal of the first transistor;

a bias circuit, coupled to the control terminal of the first transistor, for generating a bias signal that biases the first transistor to amplify the radio frequency input signal, the bias circuit including a correction transistor having operating characteristics which substantially mirror operating characteristics of the first transistor, the bias signal being dependent upon the operating characteristics of the correction transistor to compensate for at least one change in the operating characteristics of the first transistor;

wherein:

a device structure of the correction transistor is substantially the same as a device structure of the first transistor, the correction transistor and the first transistor comprising MOS transistors;

at least one dimension of the correction transistor is scaled relative to the corresponding dimension of the first transistor; and changes in the operating characteristics of the correction transistor due to gate oxide charging are reflected in the bias signal generated by the bias circuit so as to offset changes in the operating characteristics of the first transistor due to gate oxide charging.

23. An amplifier circuit, comprising:

a first transistor having a control terminal coupled to receive a radio frequency input signal and an output terminal which provides a radio frequency output signal based upon the radio frequency input signal;

a pull-up device connected to the output terminal of the first transistor;

a bias circuit, coupled to the control terminal of the first transistor, for generating a bias signal that biases the first transistor to amplify the radio frequency input signal, the bias circuit including a correction transistor having operating characteristics which substantially mirror the operating characteristics of the first transistor, the bias signal being dependent upon the operating characteristics of the correction transistor to compensate for at least one change in operating characteristics of the first transistor; and wherein:

the correction transistor and the first transistor comprise MOS transistors; and changes in the operating characteristics of the correction transistor due to gate oxide charging are reflected in the bias signal generated by the bias circuit so as to offset changes in the operating characteristics of the first transistor due to gate oxide charging.

24. An arrangement for biasing a power transistor, comprising:

means for substantially mirroring operating characteristics of the power transistor, said means for substantially mirroring operating characteristics of the power transistor including a compensation transistor, at least two dimensions of the compensation transistor being scaled relative to a corresponding at least two dimensions of the power transistor;

means for generating a bias signal responsive to the mirrored operating characteristics; and means for coupling the bias signal to a control terminal of the power transistor to compensate for a variation in the operating characteristics of the power transistor.

25. The arrangement according to claim 24, wherein the arrangement comprises a base station.

26. The arrangement according to claim 24, wherein the arrangement comprises a transmitter.

27. The arrangement according to claim 24, wherein the arrangement comprises a mobile station.

28. The arrangement according to claim 24, wherein:

the operating characteristics of the power transistor comprise operating characteristics of the power transistor due to gate oxide charging; and corresponding operating characteristics of the compensation transistor due to gate oxide charging are reflected in the bias signal generated by the means for generating a bias signal so as to offset changes in the operating characteristics of the power transistor due to gate oxide charging.

* * * * *

UNITED STATES PATENT AND TRADEMARK OFFICE
CERTIFICATE OF CORRECTION

PATENT NO.      : 6,304,129 B1
DATED           : October 16, 2001
INVENTOR(S)     : Blair et al.

It is certified that error appears in the above-identified patent and that said Letters Patent is hereby corrected as shown below:

Drawings,
Figure 1, replace "C8" with -- C6 --; replace "C6" with -- C5 --; and replace "C3" with -- C1 --.

Column 4,
Line 40, replace "regulator circuit" with -- regulator circuit 5 --.

Signed and Sealed this

Eleventh Day of February, 2003

JAMES E. ROGAN
*Director of the United States Patent and Trademark Office*